United States Patent [19]
Kitamura et al.

[11] Patent Number: 5,432,370
[45] Date of Patent: Jul. 11, 1995

[54] HIGH WITHSTAND VOLTAGE M I S FIELD EFFECT TRANSISTOR AND SEMICONDUCTOR INTEGRATED CIRCUIT

[75] Inventors: Akio Kitamura; Naoto Fujishima; Gen Tada, all of Kawasaki, Japan

[73] Assignee: Fuji Electric Co., Ltd., Kanagawa, Japan

[21] Appl. No.: 319,774

[22] Filed: Oct. 7, 1994

Related U.S. Application Data

[63] Continuation of Ser. No. 106,983, Aug. 16, 1993, abandoned.

[30] Foreign Application Priority Data

Aug. 17, 1992 [JP]  Japan ................................ 4-217705
Nov. 19, 1992 [JP]  Japan ................................ 4-309920

[51] Int. Cl.⁶ ..................... H01L 29/10; H01L 29/78
[52] U.S. Cl. .................................. 257/339; 257/336; 257/337; 257/343; 257/401; 257/409
[58] Field of Search ............... 257/335, 336, 337, 338, 257/339, 340, 343, 401, 409

[56] References Cited

U.S. PATENT DOCUMENTS

| | | | |
|---|---|---|---|
| 4,609,929 | 9/1986 | Jayaraman et al. | 257/339 |
| 5,023,678 | 6/1991 | Kinzer | 257/343 |
| 5,034,790 | 7/1991 | Mukheries. | |
| 5,105,243 | 4/1992 | Nakagawa et al. | 257/339 |
| 5,237,186 | 8/1993 | Nakagawa et al. | 257/343 |
| 5,258,641 | 11/1993 | Kida et al. | 257/343 |

FOREIGN PATENT DOCUMENTS

| | | | |
|---|---|---|---|
| 0061551 | 10/1982 | European Pat. Off. | |
| 0337823 | 10/1989 | European Pat. Off. | 257/339 |
| 2220096 | 9/1974 | France. | |
| 3816002 | 12/1988 | Germany. | |
| 4107909 | 9/1991 | Germany. | |
| 63-219667 | 9/1987 | Japan | 257/339 |
| 63-80569 | 4/1988 | Japan | 257/343 |
| 63-314869 | 12/1988 | Japan. | |
| 1-191477 | 8/1989 | Japan | 257/343 |
| 4-304658 | 10/1992 | Japan | 257/339 |

OTHER PUBLICATIONS

IEEE Journal of Solid-State Circuits, vol. SC-19, No. 3, Jun. 1984, New York, pp. 406-413.
IEEE International Solid State Circuits Conference, vol. 24, Feb. 1981, New York, Descamps et al, "High--Voltage Amplifier for Color", pp. 28-29.
Technical Digest of the International Electron Devices Meeting 1982, San Francisco, Calif., Dec. 13-15, 1982; A. W. Ludikhuize, "High-Voltage DMOS and PMOS in ANALOG IC'S", pp. 81-84.
Patent Abstracts of Japan, vol. 014, No. 252, May 1990.
"Optimization and Surface Charge Sensitivity of High--Voltage Blocking Structures with Shallow Junctions", Yilmaz, H., IEEE Transactions on Electron Devices, vol. 38, No. 7, pp. 1666-1675, Jul. 1991.

*Primary Examiner*—Ngân V. Ngô
*Attorney, Agent, or Firm*—Finnegan, Henderson, Farabow, Garrett & Dunner

[57] ABSTRACT

A semiconductor integrated circuit device is provided in which a highly reliable and low cost intelligent power semiconductor is mounted on the same substrate as that of a control circuit having a logic element, such as a low withstand voltage CMOS etc., and high withstand voltage and high current output MIS field effect transistor. A high withstand voltage MOSFET is composed of a vertical MOS portion 25 formed in one side of a laterally widened well layer 2 and a drain portion formed in the other side thereof and a second base layer 4 is formed on the surface of the well layer 2. Accordingly, a depletion layer widened just under the MOS portion 25 and the second base layer 4 develops a JFET effect at OFF time thereby realizing a high withstand voltage and reliability is provided since the generation of hot carriers can be prevented by the second base layer 4.

22 Claims, 12 Drawing Sheets

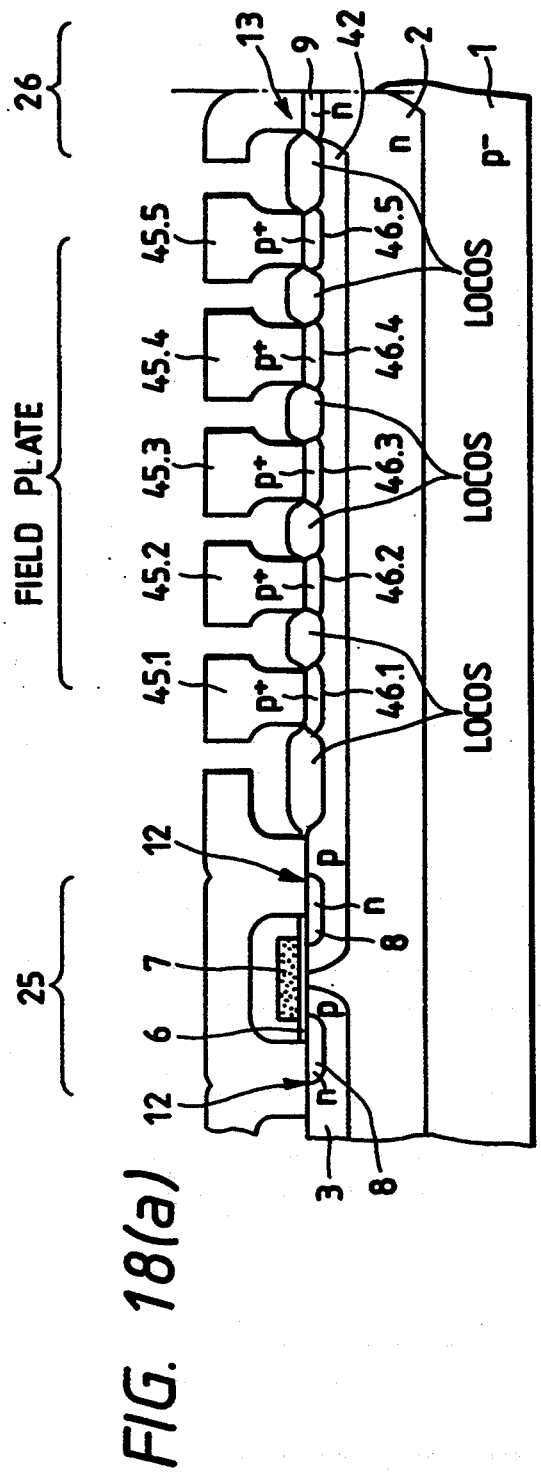
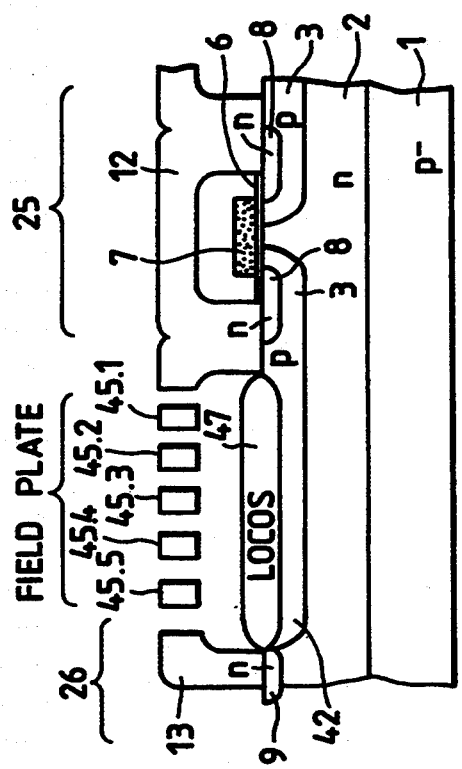
FIG. 18(a)
FIG. 18(b)

HIGH WITHSTAND VOLTAGE M I S FIELD EFFECT TRANSISTOR AND SEMICONDUCTOR INTEGRATED CIRCUIT

This application is a continuation of application Ser. No. 08/106,938, filed Aug. 16, 1993, now abandoned.

BACKGROUND OF THE INVENTION

The present invention relates to MIS field effect transistors, and more particularly to MIS field effect transistors having high withstand voltage and to a semiconductor integrated circuit device providing a high withstand voltage MIS field effect transistor.

FIGS. 19 and 20 show the constitution of a conventional high withstand voltage MIS field effect transistors. The high withstand voltage MIS field effect transistor shown in FIG. 19 is a MOSFET produced by the double diffusion process and is called a vertical DMOS since the current just under the gate is caused to flow in a vertical direction in a semiconductor substrate. The high withstand voltage MIS field effect transistor shown in FIG. 20 is a MOSFET produced by the same double diffusion process as in FIG. 19 and is called a horizontal DMOS since the current Just under the gate is caused to flow in a transverse direction in a semiconductor substrate.

The vertical DMOS shown in FIG. 19 is an effective structure as a discrete element, in which an n+-type drain layer 9 has a back surface disposed on a drain electrode 13, an n-type epitaxial layer 20, hereinafter referred to as an "epi layer", is formed on the drain layer 9, and a plurality of p-type base layers 3 are provided on the surface of the epi layer 20. Further, an n+-type source layer 8 is formed in each p-type base layer 3.

Thus, a gate electrode is provided over the epi layer 20 through a pair of source layers 8 and the base layer 3, thereby forming a vertical element. Therefore, when a reverse bias voltage is applied in the vertical DMOS, a depletion layer is extended in the vertical direction. To maintain a sufficient withstand voltage, the impurity concentration of the epi layer 20 should be relatively lowered and the thickness thereof should be sufficient.

On the other hand, a horizontal DMOS (FIG. 20) is formed by using a p-type substrate 1-1. A p type base layer 3-1 is provided on the surface and an n+-type source layer 8-1 is formed in the base layer 3-1 substrate. An n+-type drain layer 9-1 is provided on the same surface off the substrate 1-1 facing the source layer 8-1. The drain layer 9-1 is connected to the base layer 3-1 by an n-type offset layer 18-1 and a gate electrode 7-1 is disposed over the source layer.8-1, the base layer 3-1 and the offset layer 18-1. Thus, when a reverse bias voltage is applied, a depletion layer is extended horizontally in the offset layer 18-1. To maintain the withstand voltage, a long offset layer 18-1 is suitably provided.

A power IC has been developed in which a MOSFET is provided with a withstand voltage of several hundred volts (v) or more and a high current output of several amperes (A) and in which a control circuit portion operates at a low voltage of about 5 V. As disclosed in the Japanese patent publication (kokai) No. 63-314869, an IC for switching power supplies has already been realized.

However, to obtain such power IC at a low cost, miniaturization of chip size is indispensable. Therefore, size reduction of a power MOSFET, which has a large area in a power IC, is important. When the power MOSFET portion is produced, if the production process is increased, reduction of the production cost is difficult, if not impossible.

In the conventional vertical DMOS described above, as previously noted, adequate thickness is needed-to maintain a sufficient withstand voltage. The thickness of the CMOS substrate, etc., of a control circuit portion, can not easily be set to obtain a sufficient withstand voltage. Further, the vertical current flows and the element isolation have to be considered. In this case, since the formation of a buried diffusion layer and epitaxial growth are needed, required man-hours of labor are increased.

On the other hand, in the horizontal DMOS, the depletion layer is laterally extended and a problem of the thickness of the substrate does not occur. Nevertheless, to assure a necessary withstand voltage, a long offset layer is needed. Since assurance of the cross section of the offset layer is difficult, the resistance is easily increased during the on time. Further, since the current is caused to flow in a lateral direction, the carriers are injected into an oxide film formed on the surface of the substrate and are easily changed to hot carriers in a high current density region, whereby failure in the control circuit portion can occur and assurance of reliability of the device is difficult.

Further, in the horizontal DMOS, a field oxide film having a thickness of about a few thousand Angstroms is usually formed between the source and the drain. In this case, in both edge portions of the horizontal DMOS a so called "bird's beak" is concentrated and a residual stress is generated in the formation of the field oxide film. Thus, crystal defects are easily generated. Further, a so called "white ribbon", in which a nitride is stacked in the bird's beak, is generated whereby a withstand voltage for the gate oxide film is remarkably deteriorated. Further, it is well known that the amount of the interface electric charge in the interface between the field oxide film and silicon is large compared to the interface between the gate oxide film and silicon. As a result, the withstand voltage property is disadvantageously deteriorated.

SUMMARY OF THE INVENTION

The present invention has been made in view of the above circumstances and has as an object of the present invention a high withstand voltage MIS field effect transistor which realizes the merits of the vertical DMOS and the horizontal DMOS and which can be mounted with the element constituting a control circuit portion of CMOS etc. on the same substrate while realizing high reliability and sufficiently high withstand voltage.

To solve the above-mentioned problems, according to the present invention, there is formed a high withstand voltage MIS field effect transistor by providing a vertical MIS portion and a continued well region extended to a drain layer in a lateral direction and by providing in the transistor a second base region on the well region. The high withstand voltage MIS field effect transistor has a second conducting type well region formed on a first conducting type semiconductor substrate; a MIS portion has a pair of first conducting type first base layers formed in one edge of the well region, second conducting type source layer formed in this first base layers and a gate electrode disposed over this pair of source layers through an insulating layer; and a drain portion providing a second conducting type drain layer formed in the other edge of the well region. The transistor is characterized in that a field oxide film is formed on the surface of the well region through a first conducting type second base layer over the MIS portion and the drain portion.

It is preferable that the drain layer is a breakdown-type drain layer formed in a manner that the well region is connected to the edge portion of the drain layer. A first conducting type, high concentration, buried layer is formed under the drain layer. A MIS portion, effective to withstand high voltage, for example, a reverse bias voltage of at least about 30 V, has a depletion layer expanded from the pair of base layers to the well region. As a source electrode connected to the source layer, it is preferable to use a field plate type source electrode extended by about 5 micrometers or more onto the field oxide film on the second base layer. As a drain electrode connected to the drain layer, it is preferable to use a field plate type drain electrode extended by about 5 micrometers: or more onto the field oxide film on the second base layer. Further, the impurity concentration of the second base layer is effectively lower than the impurity concentration of the first base, layer.

As a flat structure of such high withstand voltage MIS field effect transistor, it is preferable that the second base layer and the source layer be substantially concentrically formed with respect to the drain layer as a center. The second base layer may provide at least one portion which is exposed for the field oxide film.

As a means for actively decreasing influence by the field oxide film and forming a high withstand voltage element, it is preferable that a high withstand voltage MIS field effect transistor have a second conducting type well region formed on a first conducting type semiconductor substrate; a MIS portion providing in one edge of this well region a first conducting type base layer, a second conducting type source layer formed in this base layer and a gate electrode disposed through an insulating gate film over this source layer and the well region; a drain portion providing a second conducting type drain layer formed in the other edge of the well region, and a conducting region is disposed through a gate insulating film on at least one portion of the surface of the well region over the MIS portion and drain portion. In this process, the transistor can be easily formed by using polycrystalline silicon for the conducting region.

It is preferable that a first conducting type offset region is formed on at least one portion of the surface of the well region over the MIS portion and drain portion and that the at least one portion of the offset region is formed under the gate electrode. Additionally, to lower the resistance of the well region, it is preferable that an offset region have at least two or more offset island regions. By using a vertical MIS portion providing at least one pair of the base and source layers and gate electrode disposed over the source layer and said well region, at least any one of the base layers is electrically connected to the offset layer. In the high withstand voltage MIS field effect transistor, a source electrode connected to the source layer is a field plate type source electrode extended toward the drain layer, or a drain electrode connected to the drain layer is a field plate type drain electrode extended toward the MIS portion. Further, a breakdown-type drain layer and a first conducting type high concentration buried layer can be applied to the high withstand voltage MIS field effect transistors. The source layer is substantially concentrically formed using the drain layer as a center.

Further, it is advantageous to use a high withstand voltage MIS field effect transistor having a second conducting type well region formed on a first conducting type semiconductor substrate; a MIS portion providing in one edge of this well region a first conducting type base layer, a second conducting type source layer formed in this base layer and a gate electrode disposed through an insulating gate film over this source layer and the well region; and a drain portion providing a second conducting type drain layer formed in the other edge of the, well region, the MIS portion being substantially concentrically formed using the drain portion as the center. At least one portion of the well portion over the MIS portion and drain portion is a withstand voltage securing region capable of securing a desired withstand voltage with reference to the distance between the MIS portion and drain portion and has a voltage transferring means capable of transferring the voltage in the, withstand voltage securing region to the well region. It is desirable to use a field plate as the voltage transferring means to apply the voltage in the withstand voltage securing region.

The present invention further comprises a semiconductor integrated circuit device characterized in that the above-mentioned high withstand voltage MIS field effect transistor is formed on a substrate in which at least one of a bipolar transistor capable of providing a logic circuit or a MIS field effect transistor. When the high withstand voltage MIS field effect transistor and a first conducting type MIS field effect transistor, having at least one of a digital circuit and an analog circuit, are formed on the same substrate, the well region of the high withstand voltage MIS field effect transistor and the second conducting type well layer of a MIS field effect transistor may be commonly formed.

When a reverse bias voltage is applied in the above-mentioned high withstand voltage MIS field effect transistor, depletion layers are first extended from the pair of the first base layer and the substrate to the well region in the vertical MIS portion and the current path therebetween is interrupted by the JFET effect. Further, since the transistor has a high withstand voltage, a region in which a depletion layer is extended in a lateral direction in a well region as in the horizontal DMOS can be obtained. Thus, the high withstand voltage MIS field effect transistor can be formed as a small and laterally thin element by using double diffusion as in the horizontal DMOS and can be formed on the same substrate as in the semiconductor element composing a control circuit portion of a CMOS etc.

Depletion layers are extended from the lower substrate and the upper second base layer in this well region and the current path is interrupted by the JFET effect even in this well region. Consequently, a high withstand voltage property can even be maintained in the well region with the lateral length, and there is no need for a well region length that raises the problem of increased resistance in the horizontal DMOS. Since the impurity concentration of the substrate is low, when the width of the depletion layer is made uniform by decreasing the impurity concentration of the second base layer more than in the first base layer, the JFET effect can be efficiently obtained in this region.

Further, since the second base layer has been formed in the surface of the well region which forms a current path in an ON time, the generation of hot electrons in a field oxide film is prevented whereby an improvement in reliability can be realized. Furthermore, the influences of the bird's beak of the field oxide film and the amount of interface electric charge can be also prevented.

When the breakdown-type drain layer is formed in the manner that the well region is connected to the edge portion of the drain layer, the electric field is concentrated at the connection portion between the well region and the drain layer and the point of breakdown can be set at a drain side and the withstand voltage property, surge-proof property and the reliability of the gate and source sides, i.e., MIS portion, can be improved. Thus, the reliability of the MIS portion and the control circuit portion are enhanced thereby enabling the reliability of an integrated circuit using this high withstand voltage MIS field effect transistor to be improved. Even if a first conducting type high concentration buried layer is formed under the drain layer, a point where the electric field is concentrated is formed, and the point of the breakdown can be set at the drain, side thereby obtaining the same effect as mentioned above.

On the other hand, by using a field plate type electrode as a source electrode and using a field plate type electrode as a drain electrode, an electric field, which is easily concentrated in the edge portion of each layer, can be relaxed and the withstand voltage of the present high withstand voltage MIS field effect transistor can be further improved.

When a substantially concentric structure is used as a plan for such a high withstand voltage MIS field effect transistor, edge treatment in each layer is not required and the process and the design can be easily produced. Further, when an exposed well region portion from the second base layer is formed, the cross-sectional area for current path can be increased and the ON resistance can be decreased. On the other hand, when a reverse bias voltage is applied, a depletion layer is extended from the second base layer even to the exposed portion, thereby being caused to pinch-off so that no decrease of withstand voltage occurs.

The movement of ions during production can be prevented by providing an electrically conducting region in at least a part of the well region surface over the MIS portion and the drain portion in place of the field oxide film through a gate insulating film. Even when a field oxide film is stacked on the top portion of the electrically conducting region, the diffusion of ions in the field oxide film into the gate oxide film can be prevented. And since a bird's beak is not formed on the silicon surface, the generation of the crystal defect and the white ribbon can be also prevented. Therefore, the generation of leak current in the well region surface can be prevented, enabling a high withstand voltage MIS field effect transistor.

By forming a first conducting type offset region, a depletion layer is extended from a PN junction portion between this offset region and the well region whereby the JFET effect can be obtained as mentioned above. Thus, the formation of the pinch-off is easily made and the setting of the concentration of the well region to a high level can be carried out, thereby forming a high withstand voltage and low resistance MIS field effect transistor. When at least a part of the offset region is formed under a gate electrode, the electric field just under the gate electrode can be relaxed and the improvement of the withstand voltage can be realized. Further, when an island-shaped offset region is provided, an increase of the well region surface having a high concentration can be realized whereby the well region is caused to have a low resistance and a high withstand voltage and low resistance MIS field effect transistor can be realized.

Further, the vertical MIS portion is also incorporated. The electric potential of the offset layer is actively controlled by electrically connecting at least any one of the base layers to the offset region and the JFET effect can be obtained to form a high withstand MIS field effect transistor. By introducing a field plate type source electrode or a field plate type drain electrode, the electric field concentration around the source layer or the drain layer is relaxed and a higher withstand voltage property can be obtained.

By actively controlling the surface electric potential of the well region, a desired withstand voltage property can be obtained with a shorter distance and a low resistance can be realized in the operation. In particular, a withstand voltage securing region capable of obtaining a desired withstand voltage property is provided in a part of the well region based on the distance between the source layer and the drain layer, and the voltage of this withstand securing region is applied to the other well region surface so that the field profile of the other well region can be controlled. Thus, even if the distance between the source layer and the drain layer is short, the same withstand property can be obtained as in the withstand securing region. On the other hand, since the distance between the source layer and the drain layer is short in the well region other than the withstand securing region in the operation, the resistance becomes low. Therefore, a high withstand and a low resistance MIS field effect transistor can be provided.

The above-explained high withstand voltage MIS field effect transistor can be formed in the same substrate as a bipolar transistor or a MIS field effect transistor capable of forming a logic circuit. A high withstand switching property and a highly reliable control circuit portion can thus be realized by using one substrate. Further, a well region of a high withstand voltage MIS field effect transistor and a second conducting type well layer of a MIS field effect transistor forming a control circuit can be commonly formed in a device thereby providing an advantage in production processing.

It is to be understood that both the foregoing general description and the following detailed description are exemplary and explanatory and are intended to provide further explanation of the invention as claimed.

BRIEF DESCRIPTION OF DRAWINGS

The accompanying drawings, which are incorporated in and constitute a part of this specification, illustrate a preferred embodiment of the invention and together with the description provide an explanation of the objects, advantages and principles of the invention. In the drawings:

FIGS. 18(a) and 18(b) are respective cross-sectional views showing a cross-sectional constitution of the high withstand voltage MOSFET of FIG. 17 according to the example 9;

DETAILED DESCRIPTION OF THE PREFERRED EMBODIMENT

In accordance with the present invention, a MIS field effect transistor employs unique circuit structure to achieve high withstand voltage with high reliability. An example of the present preferred embodiment of the invention is illustrated in the accompanying drawings and will now be described in detail.

Example 1

Figure 1A:
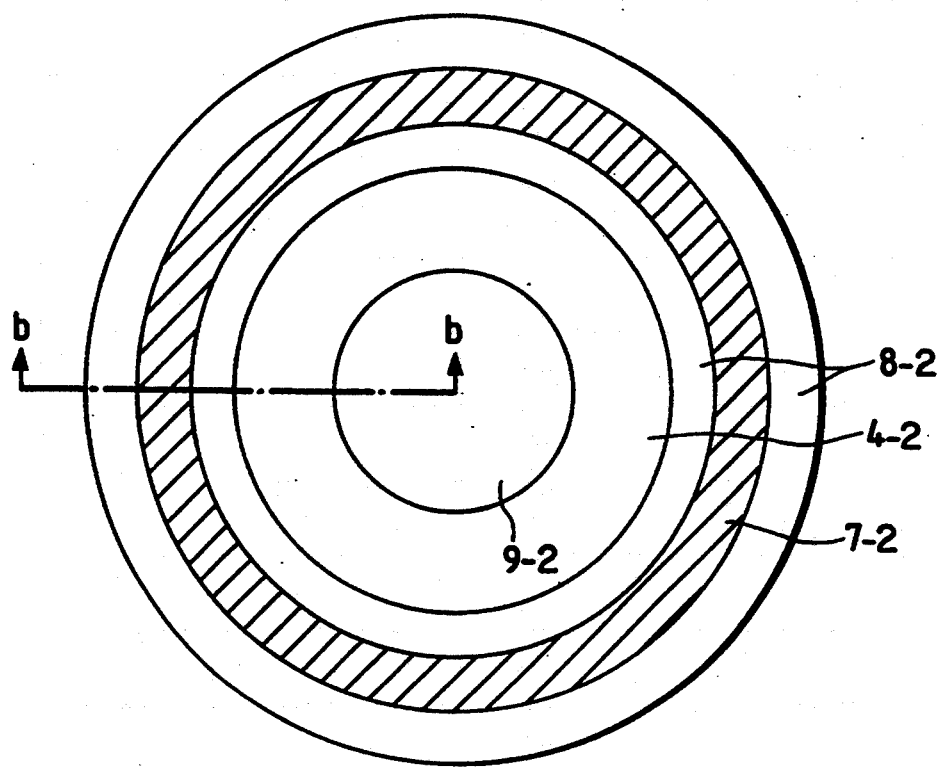
FIGS. 1(a) and 1(b), respectively, are a plan view and a cross-sectional view showing a structure of a high withstand voltage MOSFET according to an example 1 of the present invention.
Figure 1B:
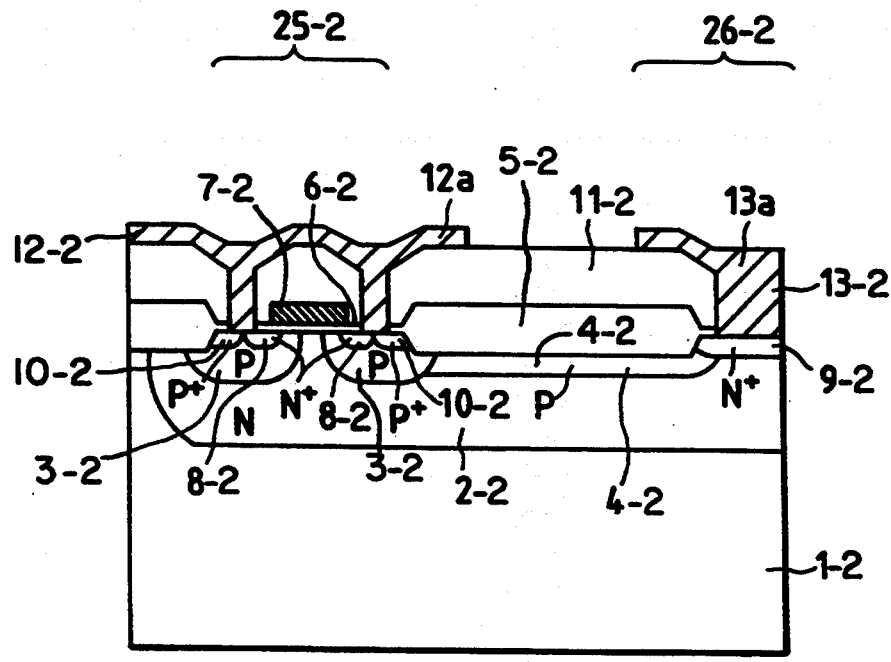

FIGS. 1(a) and 1(b) show, in plan and cross-section, structure of a high withstand voltage MOSFET according to the example 1 of the present invention. First, the structure in cross-section of the high withstand voltage MOSFET, shown in FIG. 1(b), will be described. On an about 80 ohm cm p-type silicon substrate 1-2, an n-type well layer 2-2 is formed having the surface impurity concentration of $2 \times 10^{16}$ cm$^{-3}$ and a depth of about 6 micrometer. In the well layer 2-2 a MOS portion 25-2 is formed on the left side and a drain portion is formed 26-2 on the right side. In the MOS portion 25-2 a pair of p-type first base layers 3-2 are formed with a channel forming layer having the surface concentration of about $1\ 10^{17}$ cm$^{-3}$ and a depth of 1.5 micrometer. In the first base layer, an n+-type source layer 8-2 and a p+-type base contact layer 10-2 are formed, respectively. A gate electrode 7-2 is disposed on a pair of source layers 8-2 crossing the first layer 3-2 and the well layer 2-2 through a gate oxide film 6-2 having a thickness of a few hundred Angstroms. Further, to the source layer 8-2 and the base contact layer 10-2, a source wiring 12-2 is connected, providing a 5 micrometer projected field plate portion 12a toward a drain layer 9-2, which will be described later herein, on an insulating film 11-2. Therefore, in the MOS portion 25-2, the source layer 8-2 and the first base layer 3-2 have a double diffusion structure which is similar to the channel portion of the conventional vertical DMOS. Further, the electric field in the edge portion of the source layer 8-2 is relaxed and a high withstand voltage structure is obtainable.

On the other hand, in a drain portion 26-2 formed on the right side of the well layer 2-2, an n+-type drain layer 9-2 is formed on the surface of the well layer 2-2 and to the drain layer 9-2 is connected a drain wiring 13-2. The MOS portion 25-2 side of the drain wiring 13-2 forms a field plate portion 13a projected onto the insulating film 11-2 as in the case of the source wiring 12-2. Thus, the electric field in the source layer 8-2 side edge portion of the drain layer 9-2 is relaxed and a high withstand voltage structure is realized.

In the present high withstand voltage MOSFET, a p-type second base layer 4-2 is formed between the first base layer 3-2 and the drain layer 9-2 on the well layer 2-2. The second base layer 4-2 has a surface concentration of about $5 \times 10^{16}$ cm$^{-3}$ and a depth of about 1 micrometer. Also, the second base layer 4-2 is covered with a field oxide film 5-2 having a depth of about 1 micrometer and on the film 5-2 is formed the insulating film 11-2.

The structure apparent in a plan view of the described high withstand voltage MOSFET is a concentric structure as shown in FIG. 1(a) in which the second base layer 4-2, the first base layer 3-2, the source layer 8-2 and the gate electrode 7-2 are centered on the drain layer 9-2 in order. When the concentric structure is used, treatment of the edge portion of each layer in the direction of the channel width, i.e., in the direction along the source layer and the gate electrode, is not required and the design thus facilitates manufacturing, i.e. reduction of the edge portion treatment process in the production process can be realized.

Figure 2:
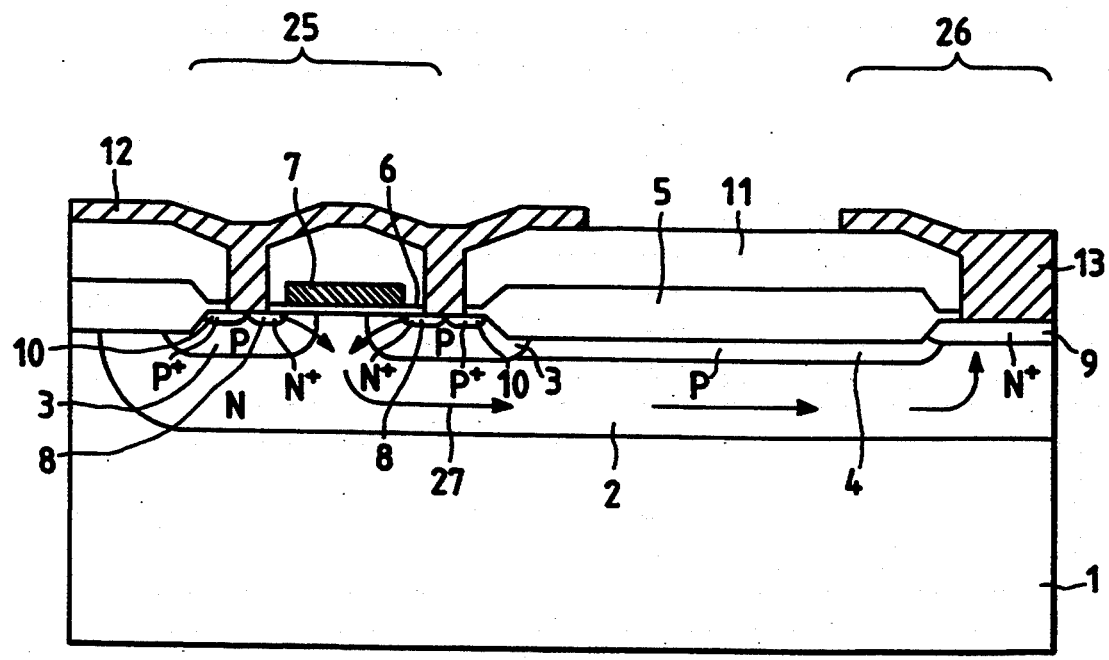
FIG. 2 graphically shows the carrier flow at ON time of the high withstand voltage MOSFET shown in FIGS. 1(a) and 1(b)

Next, referring to the cross-sectional views of FIG. 2 and FIG. 3, an operation of the withstand voltage MOSFET of FIGS. 1(a) and 1(b) will be described. FIG. 2 shows flow 27-2 of electron at ON time. In the above-mentioned MOSFET structure, the threshold voltage is about 1 V and when about 5 V is applied to the gate electrode 7-2 under a drain voltage, the polarity of the surface of the first base layer 3-2 is reversed and electrons which are carriers flow into the well layer 2-2 as shown by flow 27-2. These electrons flow downward first, as in a case of a typical vertical DMOS, and the flow is then changed to a lateral direction flow along the well layer 2-2. Then the electrons reach the drain layer 9-2 and are absorbed therein.

One point to be noted in the present example is that the path where electrons flow is covered with the first base layer 3-2 and the second base layer 4-2 so that electrons which are carriers are not brought into contact with the oxide film 5-2. Therefore, even if a large current is caused to flow, the electrons are not changed to hot electrons by being implanted to the field oxide film 5-2 and do not influence other logic circuitry.

Figure 3:
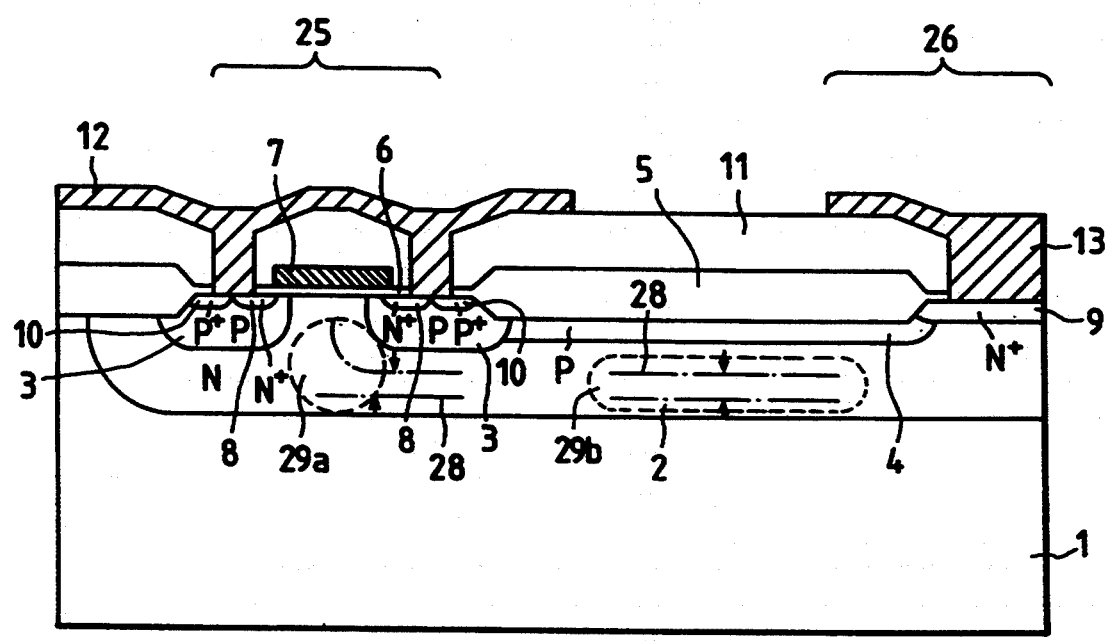
FIG. 3 graphically illustrates conditions at OFF time of the high withstand voltage MOSFET shown in FIGS. 1(a) and 1(b)

FIG. 3 shows circuit conditions at OFF time. If a low voltage is applied to the gate electrode 7-2, the source layer 8-2, the first base layer 3-2, the second base layer 4-2 and the substrate 1-2 and a high voltage is applied to the drain layer 9-2, a reverse bias voltage condition is established. In this case, as shown by a dot and broken line, a depletion layer 28-2 is extended to a PN junction between the first base layer 3-2, the second base layer 4-2 and the substrate 1-2 and the well layer 2-2 and an electric field is formed. Thus, if the depletion layer 28-2 extended from the first base layer 3-2 and the substrate 1-2 is considered, the inner portion of the well layer 2-2 under the gate electrode 7-2 is pinched-off (29a) and the path where electrons flow is blocked as in a case of JFET.

Further, if the depletion layer 28-2 extended from the second base layer 4-2 and the substrate 1-2 is considered, the inner portion of the well layer 2-2 under the second base layer 4-2 is pinched-off (29b) and the path where electrons flow is also blocked as in a case of JFET. Therefore, when a reverse bias voltage is applied, the current path is blocked in the well portion 2-2 by the JFET effect. Thus, a long offset layer having a low concentration, which was required for securing the withstand voltage in a conventional lateral DMOS is not needed and the concentration of the well layer 2-2 can be set at a high level.

In particular, since the electric field is relaxed by the above-mentioned JFET, a compatibility between the high current outputs in the high withstand voltage and the low ON resistance can be realized. To efficiently obtain the JFET effect under the second base layer 4-2, the maintenance of balance of the pinch-off is required and it is preferable that the impurity concentration in the second base layer 4-2 is set to a slightly lower level than that of the first base layer 3-2.

As explained above, in the present withstand voltage MOSFET, a withstand voltage section can be formed in a lateral direction as in a conventional lateral DMOS. Therefore, there is little or no need for a thick substrate and a sufficient withstand voltage can be obtained by using a substrate having the same thickness as that of the CMOS—and bipolar transistor forming a circuit portion, etc. The increase of the ON resistance which has been a problem of the lateral DMOS and the prior art problem of occurrence of the hot electrons can be solved. Thus, as shown in FIG. 4 and FIG. 5, a low withstand voltage control circuit portion 30-2 as well as thus formed high withstand voltage MOSFET portion 31-2 can be formed on the same substrate.

Figure 4:
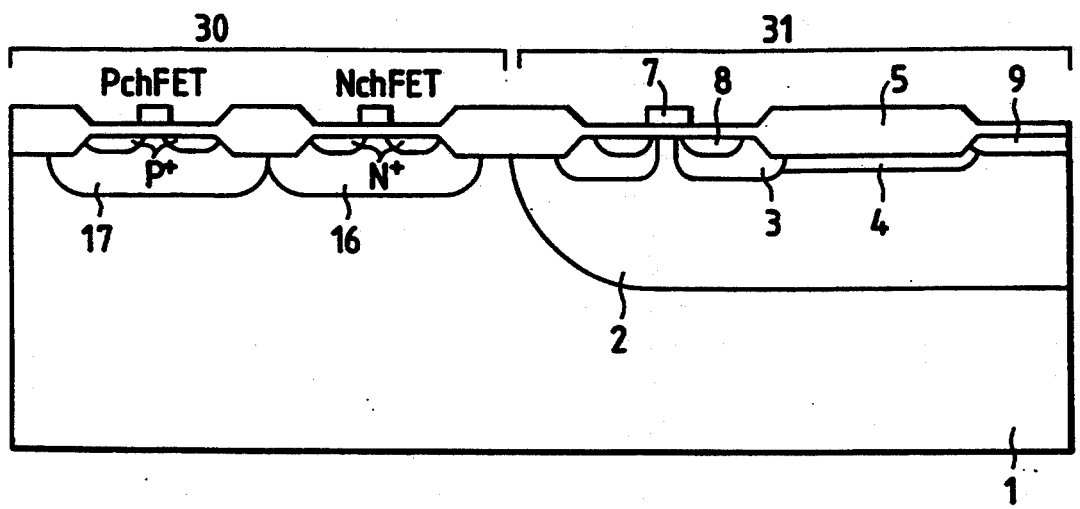
FIG. 4 is a cross-sectional view showing a semiconductor integrated device circuit in which a high withstand voltage MOSFET shown in FIGS. 1(a) and 1(b) and a CMOS composing a control circuit are formed on the same substrate.

FIG. 4 shows a cross-sectional view of a semiconductor integrated circuit device in which a low withstand voltage control circuit portion 30-2 is formed by a CMOS composed of an n channel type MOS formed in the p-type well 16-2 and a p channel type MOS formed in the n-type well 17-2 and the above-mentioned high withstand voltage MOSFET 31-2 is formed by one chip.

Figure 5:
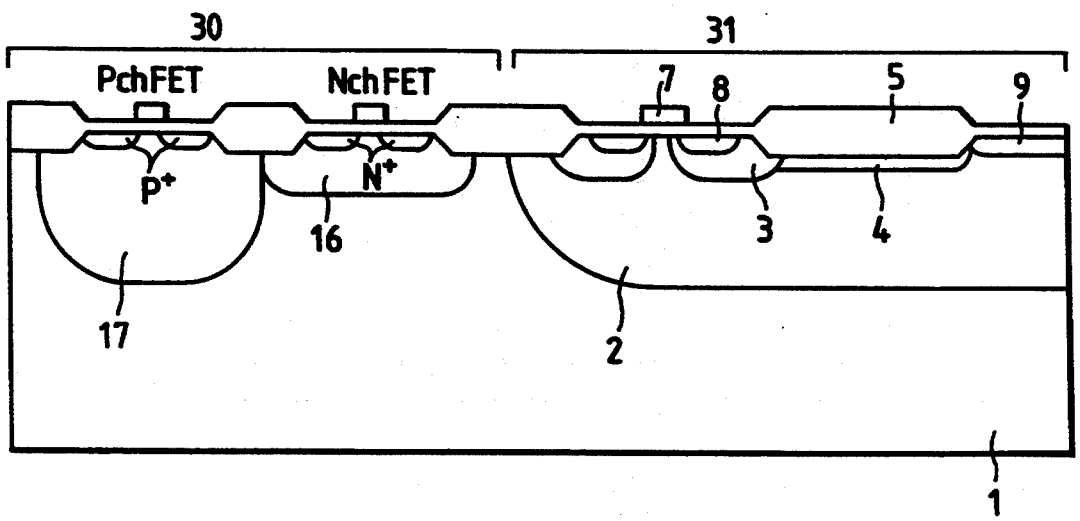
FIG. 5 is a cross-sectional view of a constitution of a semiconductor integrated circuit device in which the well regions of the CMOS and the high withstand voltage MOSFET are common as in FIG. 4.

FIG. 5 shows a cross-sectional view of a semiconductor integrated circuit device in which a low withstand voltage control circuit portion 31-2 is formed by a CMOS and the high withstand voltage MOSFET 31-2 is formed by one chip. In the present circuit device, the n-type well 17-2 and the well layer 2-2 forming the high withstand voltage MOSFET 31-2 are formed at the same time. Thus, in the one chip semiconductor integrated circuit device using the high withstand voltage MOSFET 31-2 of the present example, a high withstand voltage well and a low voltage withstand well for a control circuit portion can be formed at the same time and the time chip production process can be shortened.

Example 2

Figure 6A:
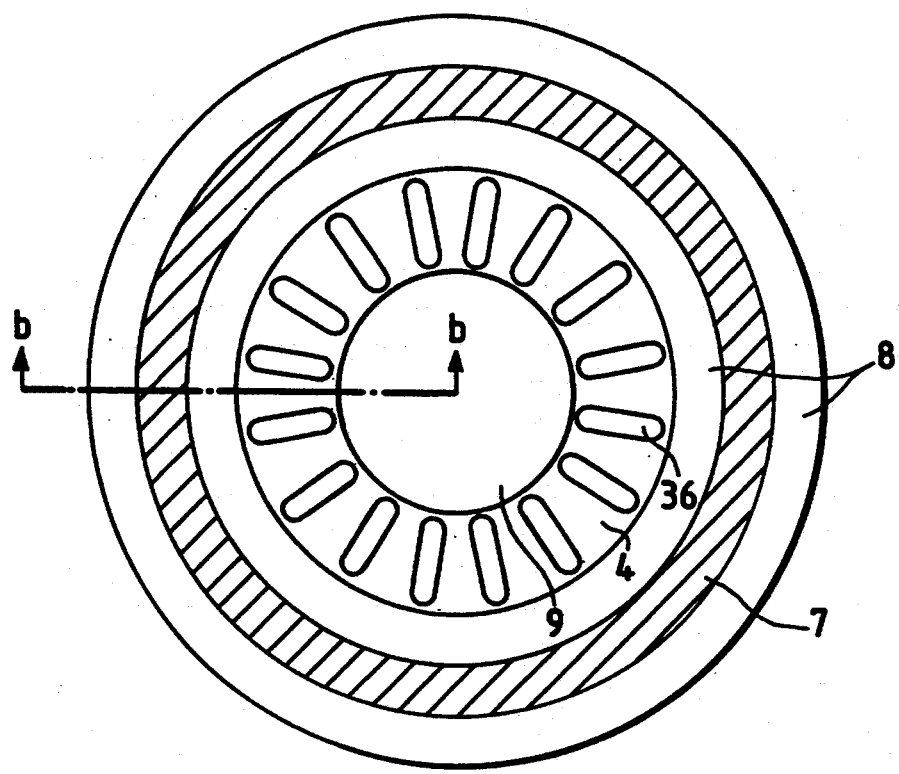
FIGS. 6(a) and 6(b) respectively show a plan view and a cross-sectional view for a structure of a high withstand voltage MOSFET according to an example 2 of the present invention.
Figure 6B:
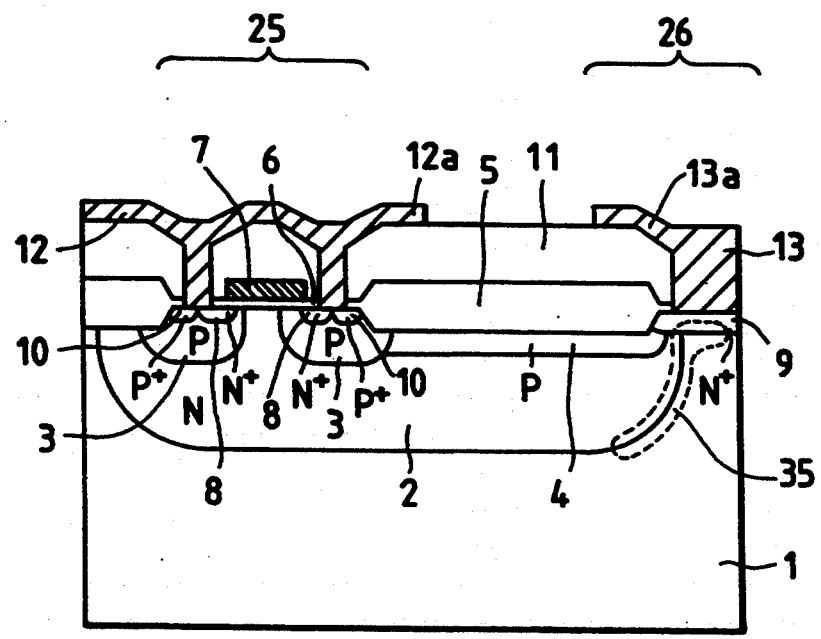

FIG. 6(a) shows a plan view and FIG. 6(b) shows a cross-sectional view of a high withstand voltage MOSFET according to the example 2 of the present invention. The present example provides a well layer 2-3, a MOS portion 25-3 and a drain portion 26-3 as in a case of the high withstand voltage MOSFET according to the example 1 of FIGS. 1(a) and 1(b) and the structure and the operation thereof are almost the same. Therefore, the explanations of the like portions will be omitted. A point to be noted in the present example is first, that the well layer 2-3 is not positioned just under the drain layer 9-3 as shown in the cross-sectional structure (FIG. 6(b)). Further, in plan, the structure (FIG. 6(a)) of a plurality of exposed portions 36-3, in which the well layer 2 was exposed, is formed.

In particular, according to the cross-sectional structure of the present example, the well layer 2-3 is under but displaced from the drain layer 9-3 and the well layer 2-3 is connected to the drain layer 9-3 at the edge portion of the source layer 8-3 side of the drain layer 9-3. Therefore, an electric field is concentrated near the drain layer 8-3 side of the well layer 2-3 and a break down point 35-3 is formed just under the drain layer 9-3. Thus, the withstand voltage property in the gate electrode 7-3 and the source layer 8-3, that is the MOS portion 25-3, can be improved and a strong structure for the break down voltage as well as the surge current can be obtained.

In a conventional DMOS structure, maintenance of the withstand voltage between the gate electrode 7-3 and the source layer 8-3 is difficult. In accordance with the invention, a depletion layer is extended in the MOS portion 25-3, even when a source-drain reverse bias voltage of about 30 V or more is applied, by setting a break down point 35-3 to the drain layer 9-3, side as in the present example, and a high withstand voltage can be maintained. Therefore, when the MOS portion 25-3 is formed on the same substrate, the reliability of the MOS portion 25-3, which can influence the control side, can also be improved and a high withstand voltage MOSFET, which is easily formed on the same substrate as a low withstand voltage control circuit having a CMOS etc., can be realized.

Referring to the device structural plan, a region in which the well layer 2-3 is projected to the second base layer 4-3, a region 36-3, in which the well layer 2-3 is exposed to the field oxide film 5-3, is formed.

Consequently, since the cross-sectional area of the well region 2-3 is increased during the operation, the ON resistance can be more decreased so that a high current output operation can be realized. On the other hand, when a reverse bias voltage is applied, a depletion layer is extended from the second base layer 4-3 sandwiching the exposed portion 36-3 and a JFET effect can be obtained substantially as in the example 1 whereby the deterioration of the withstand voltage property is small.

Example 3

Figure 7A:
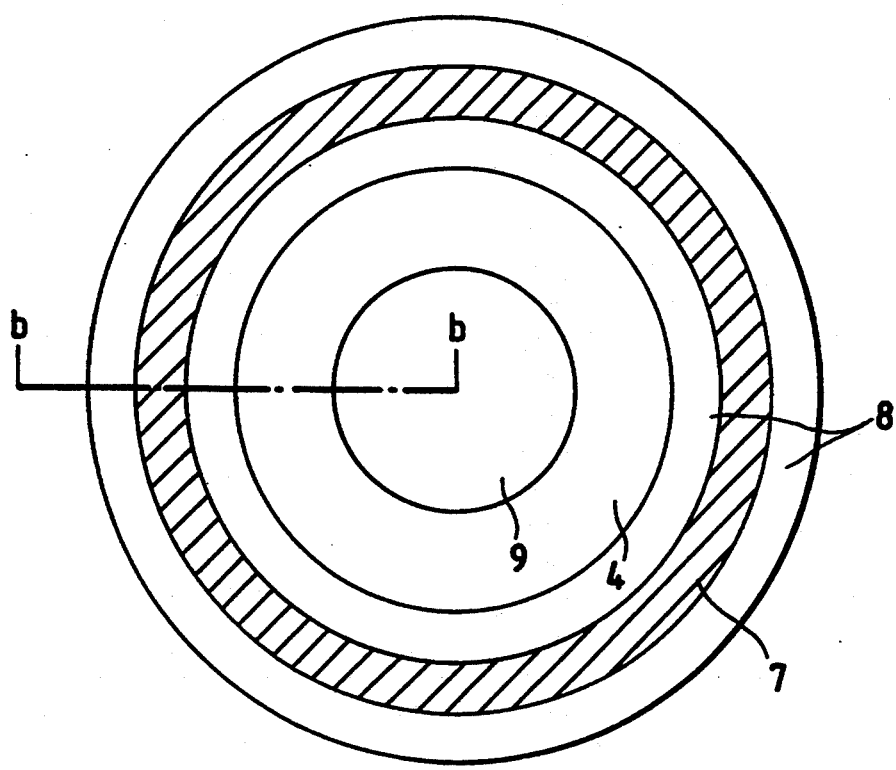
FIGS. 7(a) and 7(b) respectively illustrate a plan view and a cross-sectional view for a structure of a high withstand voltage MOSFET according to an example 3 of the present invention.
Figure 7B:
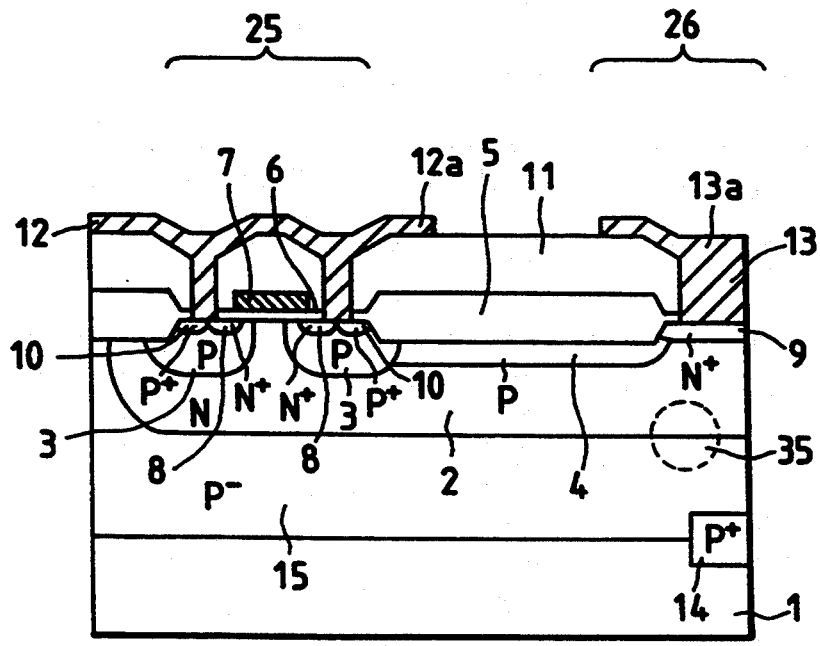

FIGS. 7(a) and 7(b) show a structural plan and a cross-sectional structure of a high withstand voltage MOSFET according to the example 3 of the present invention. The present example provides a well layer 2-4, a MOS portion 25-4 and a drain portion 26-4 as in a case of the high withstand voltage MOSFET according to the example 1 of FIGS. 1(a) and 1(b) and the structure and the operation thereof are almost the same. Therefore, the explanations of like portions will be omitted.

A point to be noted in the present example is that a p+-type buried layer 14-4 is formed just below the drain layer 9-4 in the cross-sectional structure (FIG. 7(b)). Further, to form the buried layer 14-4, a p-type epitaxial growth layer 15-4 is formed on the substrate 1-4. Since in the present example an electric field is concentrated on the upper portion of the buried layer 14-4, an area just under the drain layer 9-4 becomes a break down point. Therefore, a withstand voltage property of the MOS portion 25-4 can be improved as in the case of example 2 and a strong structure for the break down voltage and the surge can be realized.

Example 4

Figure 8:
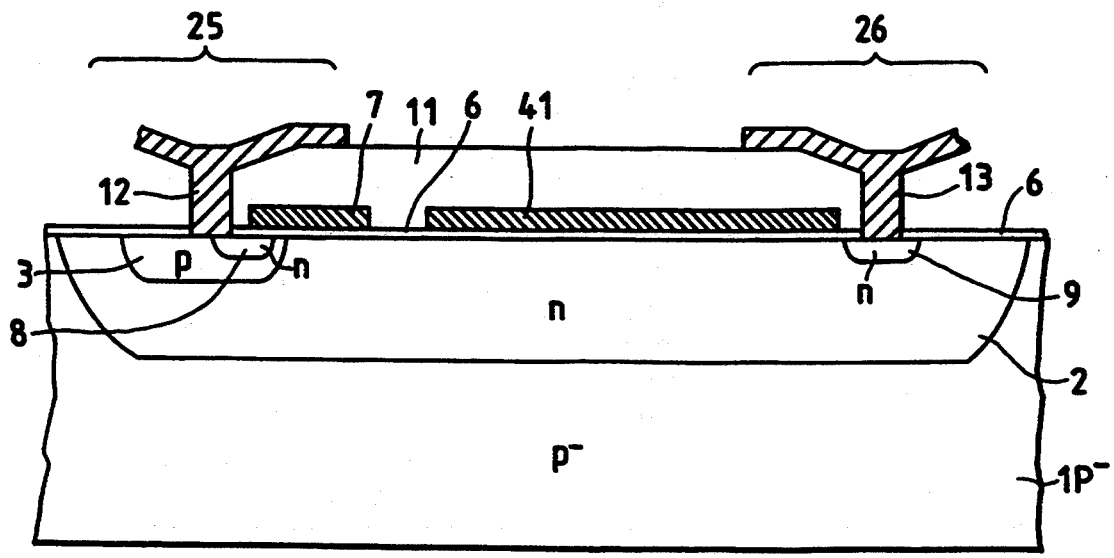
FIG. 8 is a cross-sectional view showing a structure of a high withstand voltage MOSFET according to an example 4 of the present invention.

FIG. 8 shows a cross-sectional structure of a high withstand voltage MOSFET according to the example 4. In the high withstand voltage MOSFET, an n-type well layer 2-5 is formed with a surface concentration of about $2 \times 10^{16}$ cm$^{-3}$ and a thickness of about 6 micrometer in an about 80 ohm cm p-type silicon substrate 1. In the inner surface of the well layer 2-5, a p-type base layer 3-5 is formed with a surface concentration of about $1 \times 10^{17}$ cm$^{-3}$ and in the inner surface of the base layer 3-5 an n-type source layer 8-5 is formed. The entire surface of the well layer 2-5 is covered with a gate oxide film 6-5 having a thickness of a few hundred Angstrom. Further, a polycrystalline silicon gate electrode 7-5 is disposed above the edge of the source layer 8-5, the surface of the base layer 3-5 and the surface of the well layer 2-5 through the gate oxide film 6-5. In this case, the base layer 3-5 and the source layer 8-5 form a double diffusion structure and a channel is formed by voltage applied to the gate electrode 7-5 thereby forming the MOS portion 25-5.

Further, an n-type drain layer 9-5 is formed in a surface region facing the MOS portion 25-5 in the well layer 2-5 such that a drain portion 26-5 is formed. A source wiring 12-5 is connected to the MOS portion 25-5 and drain wiring 13-5 is connected.

A point to be noted in the MOSFET of the example 4 is that a polycrystalline silicon layer 41-5 is formed above the surface of the well layer 2-5 through the gate oxide film 6-5 between the MOS portion 25-5 and the drain portion 26-5. The polycrystalline silicon layer 41-5 is an electrical conductor and prevents the storage of ions in the gate oxide film in the production by the movement of ions. By the introduction of the polycrystalline silicon layer 41-5, no field oxide film such as a LOCOS etc. is formed on the, Silicon surface and the crystal defect in the bird's beak and the influence of the white ribbon can be prevented.

When a reverse bias is applied to the MOSFET of the present example, a depletion layer is extended from the PN junction portion between the p-type base layer 3-5 and the well layer 2-5 and from the PN junction portion between the silicon substrate 1-5 and the well layer 2-5. Since impurity concentration in the well layer 2-5 and the substrate 1-5 is low, a depletion layer is increasingly extended to these regions. When a reverse bias of a few hundred V is applied, a depletion layer is extended to a region just under the polycrystalline silicon layer 41-5 and a potential profile is generated just under the polycrystalline silicon layer 41-5. Therefore, the surface of the well layer 2-5 just under the polycrystalline silicon layer 41-5 has a number of stacking faults and a number of interface charges generate a leak current thereby deteriorating the withstand property. However, in the present example, no bird's beak is generated and the amount of the, crystal defects, i.e. the stacking faults, is small. Further, since the movement of ions in production is prevented, the amount of the interface charge is also small. Consequently, the occurrence of leak current can be prevented thereby forming a high withstand voltage MOSFET. Additionally, the polycrystalline silicon layer 41-5 prevents diffusion of ions from the insulating film 11-5 stacked on the layer 41-5 to the gate oxide film 6-5 and the increase of the interface charge is small whereby a high withstand voltage can be realized. The structural plan of the high withstand voltage MOSFET of the example 4 is based on a concentrical formation using the drain portion as the center as in the above-mentioned example. Further, by using the drain portion as in the example 2 or 3 a higher withstand voltage can be realized.

Example 5

Figure 9:
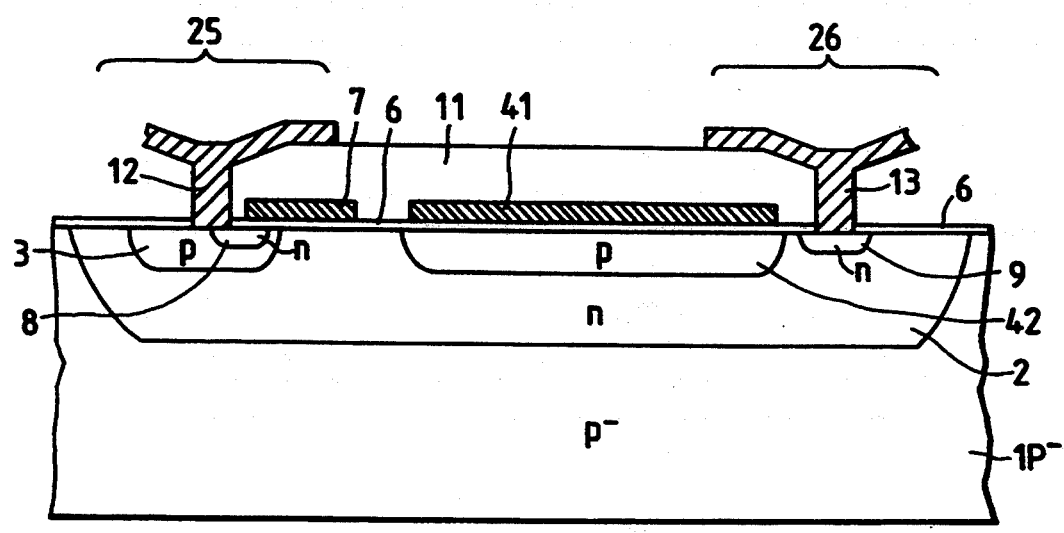
FIG. 9 is a cross-sectional view showing a structure of a high withstand voltage MOSFET according to an example 5 of the present invention.
Figure 10:
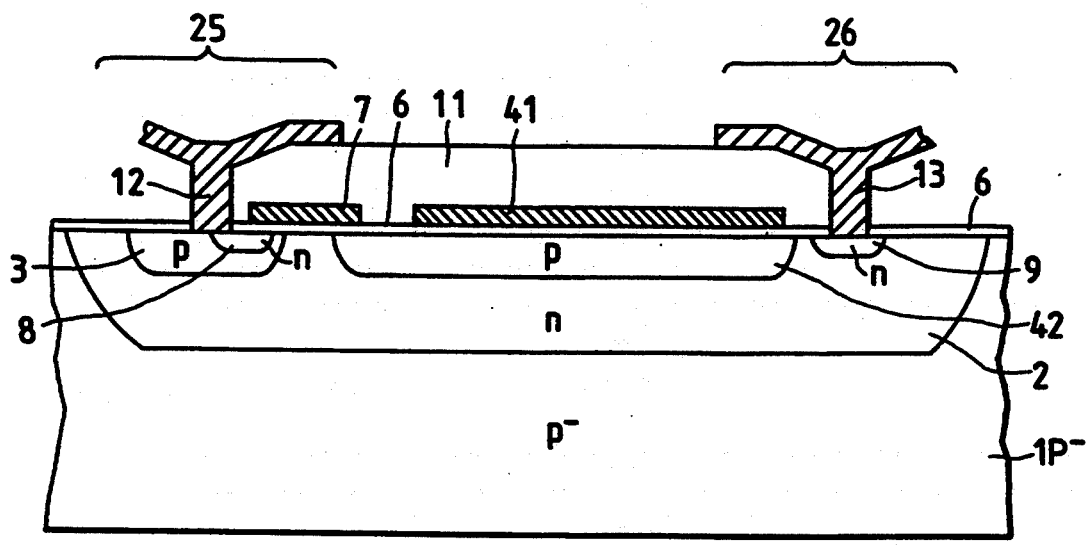
FIG. 10 is a cross-sectional view showing a structure of a high withstand voltage MOSFET according to an example 5 of the present invention.

FIG. 9 and FIG. 10 show a cross-sectional structure of a high withstand voltage MOSFET according to the example 5. Most of the structure of the MOSFET of the present example is the same as that of the example 4 and the description of like portions is omitted while denoting the like portions by the same reference numerals. A point to be noted in the structure of the MOSFET of the present example is that a p-type offset layer 42-5 having a surface concentration of $9 \times 10^{16}$ cm$^{-3}$ is formed on the surface of the well layer 2-5 between the MOS portion 25-5 and the drain portion 26-5.

First, in the high withstand voltage MOSFET shown in FIG. 9, an offset layer 42-5 is formed in a lower region of the polycrystalline silicon layer 41-5. Therefore, if a reverse bias is applied to the MOSFET, a depletion layer is extended from the PN junction portion between the offset layer 42-5 and the well layer 2-5 as well as from the PN junction portion between the base layer 3-5 and the well layer 2-5 and the PN junction portion between the substrate 1-5 and the well layer 2-5. When a depletion layer, extended from any one of the PN junction portions, is brought into contact with the offset layer 42-5, and the potential of the offset layer 42-5 is fixed, a depletion layer is extended from the entire offset layer 42-5 toward the well layer 2-5 having a low concentration. Therefore, the well layer 2-5 may be pinched off from the offset layer 42-5 and the substrate 1-5 by two depletion layers and the current path can be blocked, as in the JFET, thereby obtaining a high withstand voltage. Since a desired withstand voltage can be obtained even if the impurity concentration is increased, a low resistance during operation can be realized by increasing the impurity concentration. As described above, in the MOSFET according to the present example, a high withstand voltage as well as a low resistance can be realized. Of course, a leak current is not generated in the surface of the, well layer as in the example 4, which also realizes a high withstand voltage MOSFET Further, in a MOSFET shown in FIG. 10, an offset layer 42-5 is extended to a region Just under a polycrystalline silicon gate electrode 7-5. Therefore, the electric field concentration generated just under a polycrystalline silicon gate electrode 7-5 can be relaxed and a higher withstand voltage property can be obtained.

In this case, by applying a desired voltage to the polycrystalline silicon layer 41-5, the voltage of the offset layer 42-5 can be actively controlled and a bias-voltage which generates the pinch-off can be also controlled.

Example 6

Figure 11:
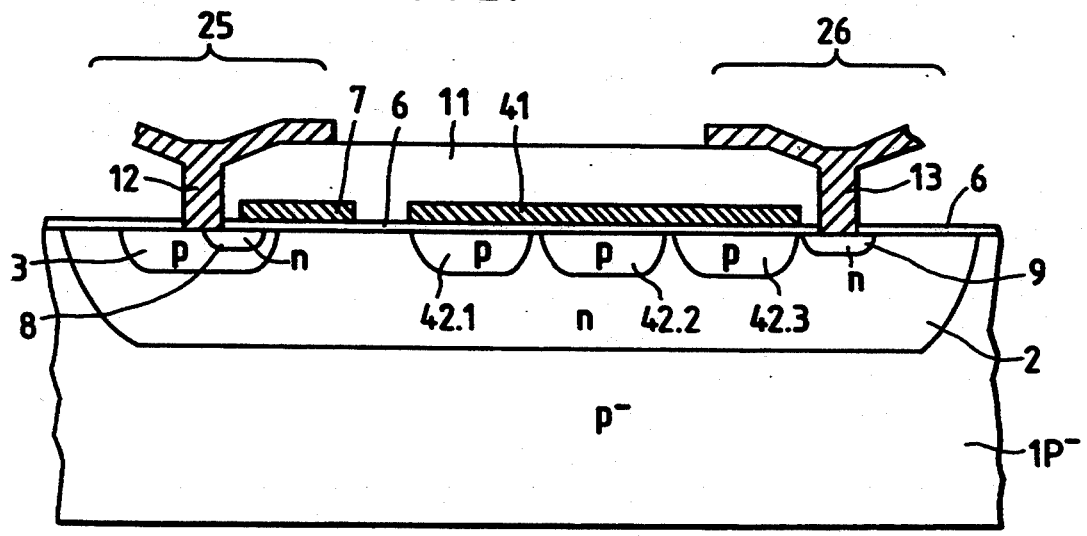
FIG. 11 is a cross-sectional view showing a structure of a high withstand voltage MOSFET according to an example 6 of the present invention.

FIG. 11 shows a cross-section of a high withstand voltage MOSFET according to the present example. The structure of the MOSFET according to the present example is substantially the same as that of the MOSFET shown in the example 4 and the descriptions of the like portions will be omitted while denoting the common portions by the same reference numerals. The points to be noted in the MOSFET of the present example are that a p-type offset layer is formed on the surface of the well layer 2-5 as in the example 5 and that the offset layer is composed of three island shaped offset layers 42.1 to 42.3. The island shaped offset layers 42.1 to 42.3 are the same p-type diffusion layers as the offset layer of the example 5 and the MOSFET of the present example is the same high withstand voltage MOSFET as the MOSFET according to the example 5 in that the depletion layers extended from such offset layers 42.1 to 42.3 are pinched-off in a reverse bias.

Further, in the MOSFET of the present example, the offset layers 42.1 to 42.3 are separated as island-shaped regions and the surface of the well layer 2-5 characteristically exists between the offset layers 42.1 to 42.3. For example, if the well layer 2-5 is formed by a thermal diffusion after an ion implantation, the impurity concentration is the highest in the well layer 2-5 surface. Thus, by forming the island shaped offset layer, the high concentration surface can be left and the impurity concentration of the entire well layer 2-5 is high and the resistance value of the well layer 2-5 is decreased. Thus, by forming the offset layer as the island shaped offset layers 42.1 to 42.3 a high withstand and a low resistance MOSFET can be formed. In a case where the well layer 2-5 is formed without ion implantation, even if, for example, an epitaxial growth is used, doped phosphorus is piled-up on the surface. Thus, by leaving the surface of the well layer 2-5, the well layer 2-5 has a high concentration. As described above, in the MOSFET of the present example, a low resistance can be realized by the JFET effect as explained in the example 5 and the impurity concentration can be increased so that a high withstand and low resistance MOSFET can be realized. When a reverse bias is applied, depletion layers are extended respectively from these island shaped offset layers 42.1 to 42.3 and the well layers between the offset layers 42.1 to 42.3 respectively have a depletion layer so that a withstand voltage is obtained. Further, since the surface of the well layer 2-5 has a small stacking fault and interface charge, the generation of leak current is very small.

The present example uses three island shaped offset layers 42.1 to 42.3. Nevertheless, two or four or more layers can be used. Further, the voltage of the island shaped offset layers 42.1 to 42.3 can be actively controlled by the polycrystalline silicon layer 41-5.

Example 7

Figure 12:
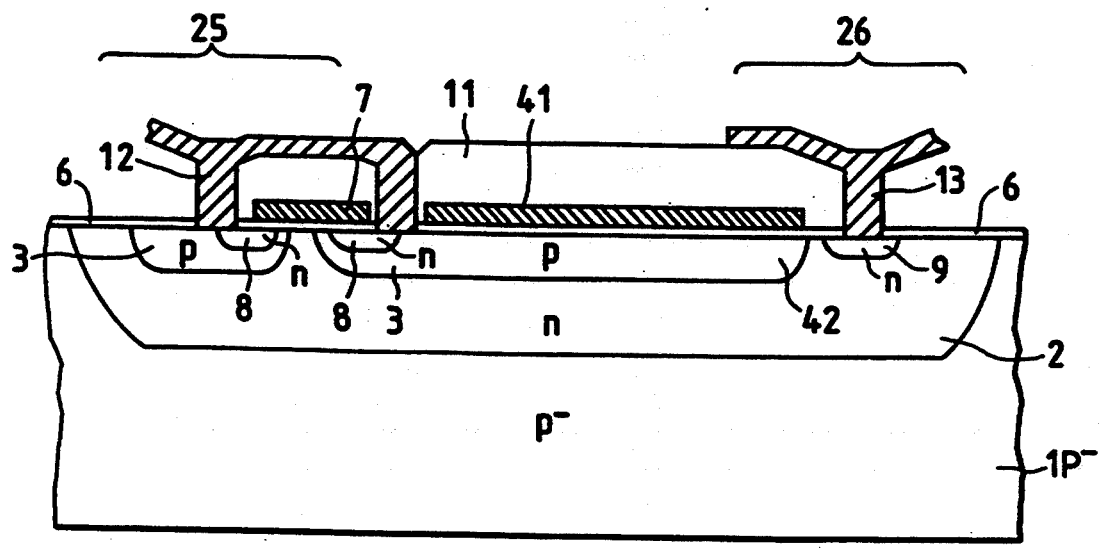
FIG. 12 is a cross-sectional view showing a structure of a high withstand voltage MOSFET according to an example 7 of the present invention.
Figure 13:
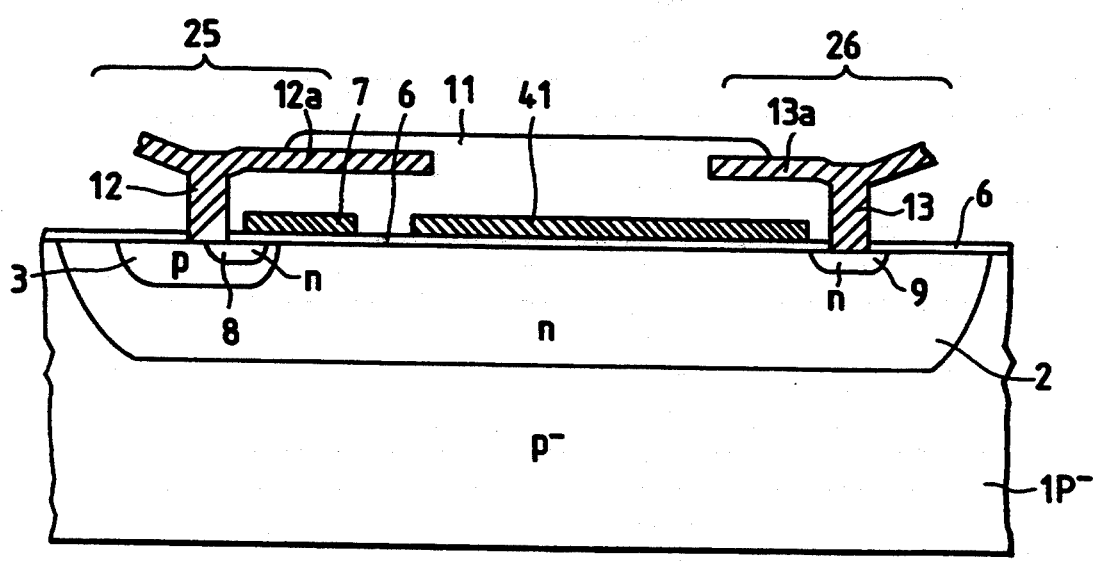
FIG. 13 is a cross-sectional view showing a structure in which an example 8 is applied in accordance with the invention to the high withstand voltage MOSFET according to the example 4.
Figure 14:
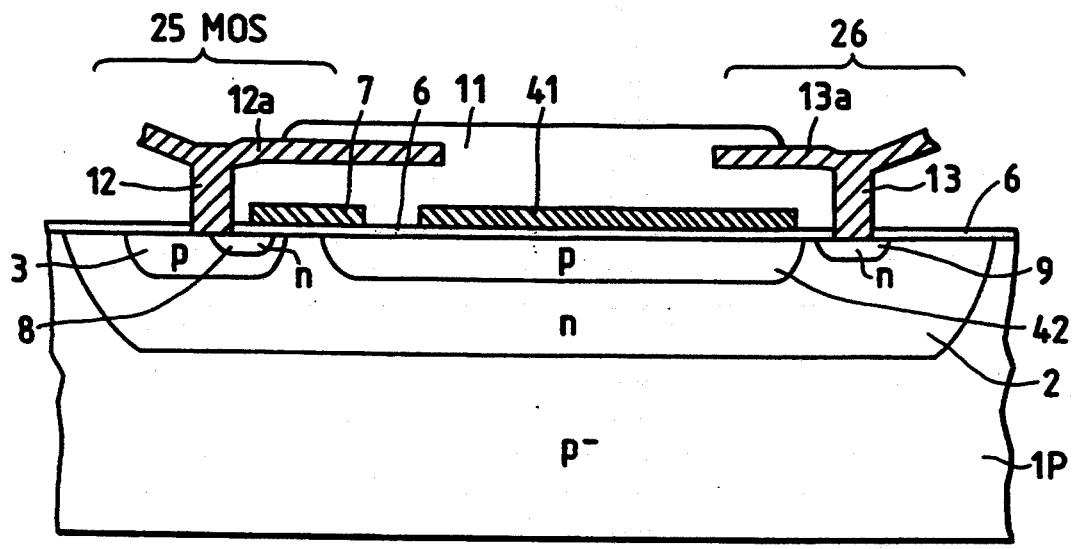
FIG. 14 is a cross-sectional view showing a structure in which the example 8 is applied in accordance with the invention to the high withstand voltage MOSFET according to the example 5.
Figure 15:
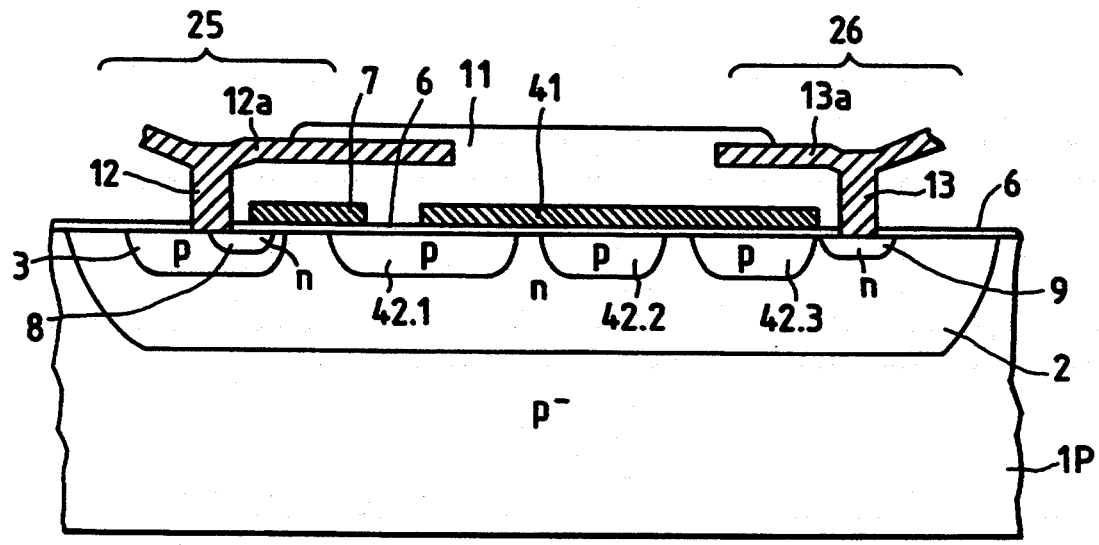
FIG. 15 is a cross-sectional view showing a structure in which the example 8 is applied in accordance with the invention to the high withstand voltage MOSFET according to the example 6.
Figure 16:
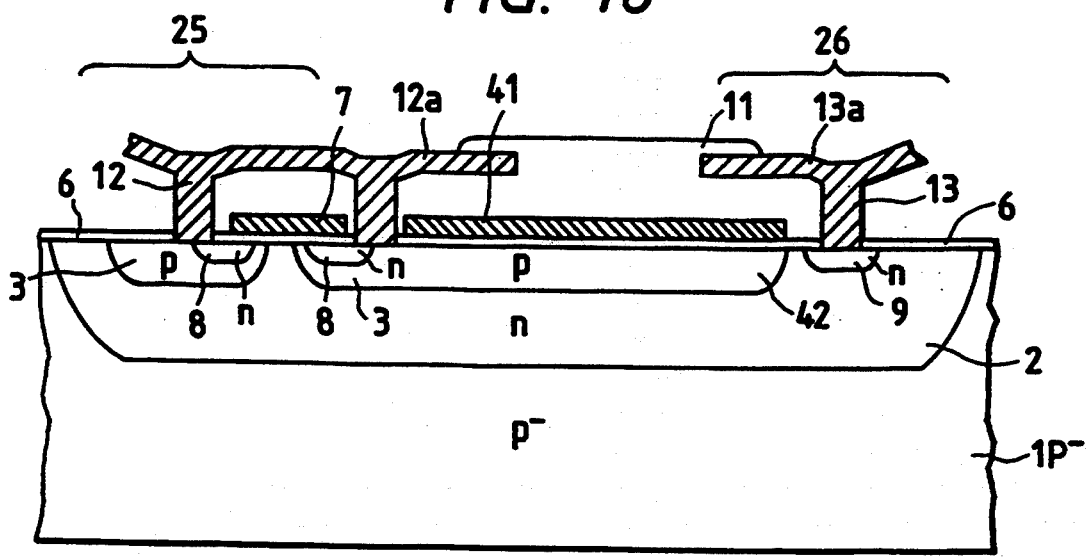
FIG. 16 is a cross-sectional view showing a structure in which the example 8 is applied in accordance with the invention to the high withstand voltage MOSFET according to the example 7.

FIG. 12 shows a cross-section of a high withstand voltage MOSFET according to the example 7. The structure of the MOSFET according to the present example is substantially the same as that of the MOSFET shown in the example 4 and the description of like portions will be omitted while denoting the like portions by the same reference numerals. The points to be noted in the MOSFET of the present example are that a MOS portion 25-5 forms a vertical MOS portion in which a pair of base layers 3-5, 3-5 and a source layer 8-5 are formed as in the example 1. Therefore, when a reverse bias is applied, as in the example 1, the vertical MOS portion 25-5 is first pinched-off and the current is blocked. In this case, since a source layer 4-5 exists just under both edges of the gate electrode 7-5, the electric field of the edges of the gate electrode 7-5 is relaxed thereby developing a high withstand voltage.

Further, in the MOSFET of the present example, the offset layer 42-5 is monolithically formed with the base layer 3-5 of the vertical MOS portion 25-5. Accordingly, the electric potential of the offset layer 42-5 is controlled by the source electric potential and pinch-off is formed in a region Just under the offset layer 42-5 thereby developing a high withstand voltage. Further, a break down point in a reverse bias operation can be set to a drain portion 26-5 side. By using the same drain structure as in the example 2 or the example 3 the withstand voltage property can be enhanced.

Example 8

FIG. 13 to FIG. 16 show a cross-section of a high withstand voltage MOSFET according to the example 8. This MOSFET is related to the MOSFET having a structure explained in the examples 4 to 7. The explanation of like portions is omitted. In the MOSFET of the present example, a field plate 12a, extended to a drain portion 26-8 side, is formed in a source wiring 12-8, and a field plate 13a, extended to a MOS portion 25-8 side, is formed in a drain wiring 13-8. The source wiring 12-8 and the drain wiring 13-8 are composed of Al. Therefore, in the MOSFET of the present example, the electric field concentration in a region to which an electric field is best concentrated near the source layer 8-8 and near the drain layer 9-8 is relaxed and the breakage of the withstand voltage is prevented. Thus, a high withstand voltage MOSFET can be realized. Of course, even if a field plate is formed merely in the source wiring 12-8 or the drain wiring 13-8, the electric field concentration near the etch layer can be relaxed whereby a high withstand voltage can be obtained.

Example 9

Figure 17:
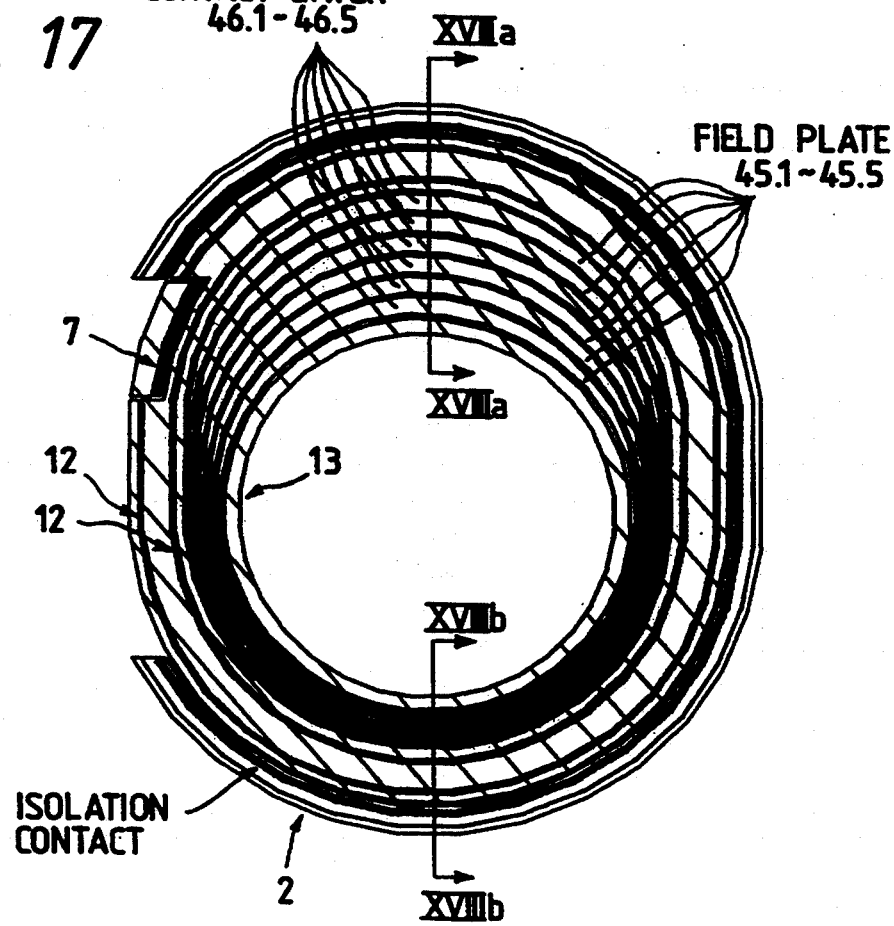
FIG. 17 is a plan view showing a plan constitution of a high withstand voltage MOSFET according to an example 9.
Figure 19:
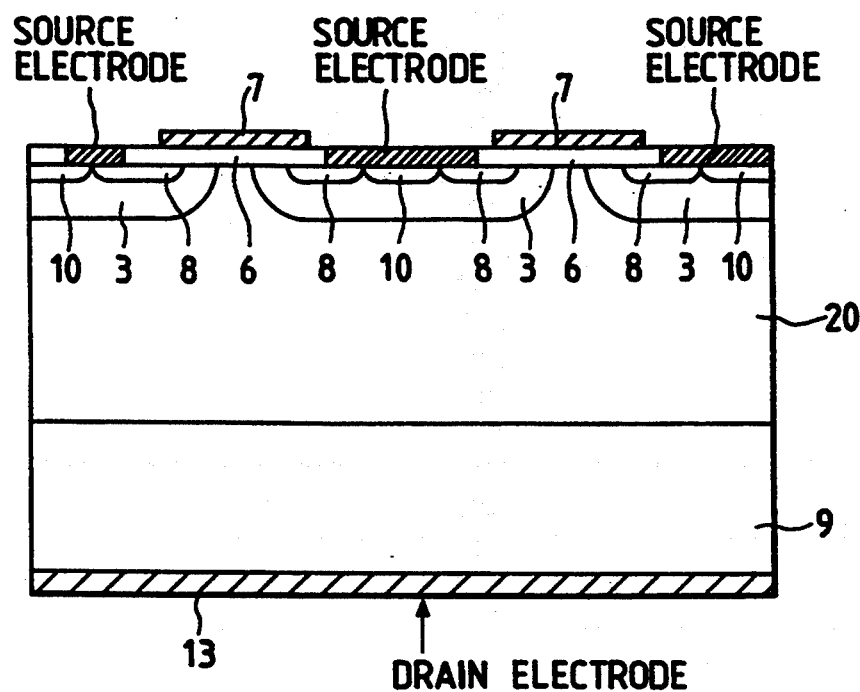
FIG. 19 is a cross-sectional view showing a conventional vertical DMOS.
Figure 20:
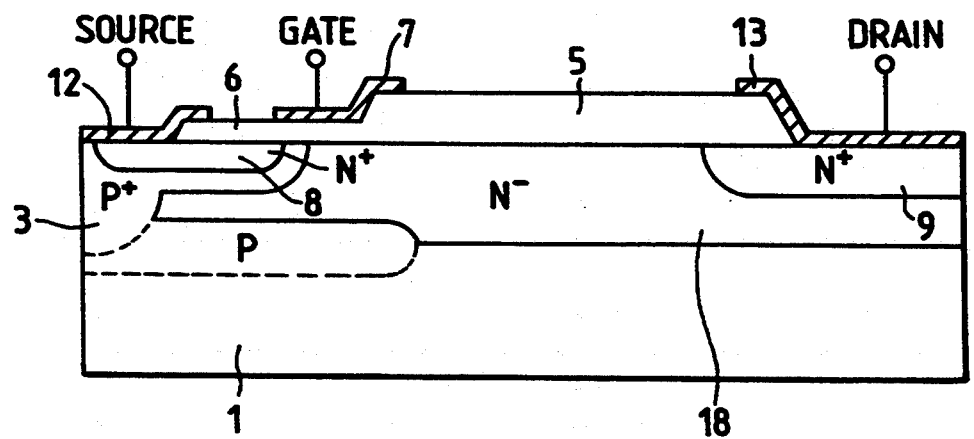
FIG. 20 is a cross-sectional view showing a conventional horizontal DMOS.

FIG. 17 and FIGS. 18(a) and 18(b) show a structural plan for a high withstand voltage MOSFET according to the example 9. In the MOSFET of the present example, a MOS portion 25-9 is a vertical MOS portion as in the example 7 and the electric potential of the offset layer 42-9 is fixed to the source electric potential. Therefore, the explanation of the portions like those of the example 7 are omitted.

A point to be noted in the MOSFET of the present example is that the electric potential of the offset layer 42-9 can be actively controlled by five field plates 45.1 to 45.5. In the MOSFET of the present example, a MOS portion 25-9 is substantially concentrically disposed about the drain portion 26-9 as the center as can be seen in FIG. 17. However, the position of the drain portion 26-9 is offset respect to the concentric circles. Therefore, the distance between the drain portion 26-9 and the MOS portion 25-9 is different for different positions. A portion of a cross-section XVIIIa is the portion having the most space between the drain portion 26-9 and the MOS portion 25-9 and in this portion a desired withstand voltage property can be maintained by the interwell layer 2-9. On the other hand, in a portion of a cross-section XIVIIIb facing the portion of the cross-section XVIIIa, the distance between the drain portion 26-9 and the MOS portion 25-9 is very short and the withstand voltage property can not be maintained by the interwell layer 2.

However, in the MOSFET of the present example, the electric potential for five positions of the offset layer shown in the cross-section XVIIIa is transferred to the field plates 45.1 to 45.5 through the field plate contacts 46.1 to 46.5. Since the field plates 45.1 to 45.5 are concentrically disposed around the drain portion 26-9, the electric potential of the offset layer 42-9 just under the field plates 45.1 to 45.5 is maintained to each electric potential of the field plates 45.1 to 45.5, i.e., the same potential as in the cross-section XVIIIa through a LOCOS 47-9 even in the cross-section XVIIIb, with the result that the electric potential profile between the MOS portion 25-9 and the drain portion 26-9 can be controlled so that a required withstand voltage can be maintained even where the cross-section XVIIIb has a short width. Therefore, even if the width is small, the withstand voltage property can be developed as in the cross-section XVIIIa. Thus, in the MOSFET of the present example, electric potential 2-9, capable of maintaining a desired withstand voltage by using a plurality of field plates, is applied to the well layer 2-9 and, in even a shorter distance well layer 2-9, a desired withstand voltage property can be obtained by controlling the potential of the well layer. Therefore, a device cycle can be shortened and high integration can be developed while having a high withstand voltage and the distance between the source layer and the drain layer can be shortened during the operation whereby a low resistance MOSFET can be realized.

Although the transferring of the electric potential is made by using five field plates in the present example, the five plates are not needed and if a required withstand voltage property can be developed, the high withstand voltage, high integration and low resistance can be also obtained by using even one field plate or two or more field plates whereby a switching element, capable of being mounted on the same substrate as a logic element, can be realized.

As described above, in the present invention when a reverse voltage is applied, a depletion layer is extended to a vertical MIS portion and an extended well region as in the horizontal DMOS and a high withstand can be maintained by a JFET. Therefore, since a higher withstand voltage property can be maintained for the lateral length of the well region, a well region length, which raises a problem of increased ON resistance of the horizontal DMOS, is not needed and lowering the impurity concentration is not required. Thus, in the high withstand voltage MIS field effect transistor of the present invention, a high withstand and high current output can be realized. Since the structure is substantially the same as that of the horizontal DMOS, the transistor can be formed on the same substrate as that of an element having control circuits such as CMOS etc. and the processes are substantially the same as that of control circuit element such as CMOS etc.

In the high withstand voltage MIS field effect transistor of the present invention, since the second base layer is formed on the surface of the well region which is a current path, carriers do not flow near the surface and problems of the hot carrier etc. are solved. Consequently, even if the transistor of the present example is formed on the same substrate as that of the control circuit, the reliability of the, device can be improved.

By disposing an electrically conducting region on at least a part of the well region surface between the MIS portion and the drain portion through an insulating film in place of a field oxide film, the influence of the insulating film on the withstand property, for example, crystal defect derived from the bird's beak, generation of the white ribbon or increase of the interface electric charge, etc., can be prevented so that a high withstand voltage property can be obtained. Further, by forming the offset regions and the island shaped offset regions, a high withstand voltage and a low resistance can simultaneously be also realized whereby a high withstand voltage and high output MIS field effect transistor can be realized.

Further, by actively controlling the surface electric potential of the well region using the field plates, a required withstand voltage property can be obtained in a shorter distance with a low resistance during operation, and a shortening of the device cycle, i.e., a high integration, can be realized.

Thus, the high withstand voltage MIS field effect transistor according to the present invention is a thin and a small sized transistor and can be formed on the same substrate as that of a low withstand voltage element such as a control circuit etc. In the transistor of the present invention, a low resistance and high current output can be realized and also a high integration can be realized.

Since in the production processes a new special process is not required, the production cost can be held down. Furthermore, the high withstand voltage MIS field effect transistor can be produced using one chip together with CMOS or BiCMOS and a sufficiently reliable device can be obtained.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A high withstand voltage MIS field effect transistor comprising a second conductivity type well region formed on a first conductivity type semiconductor substrate; a MOS portion providing a pair of first conductivity type first base layers formed in an outer portion of the well region, second conductivity type source layers formed in the first base layers and a gate electrode disposed over the source layers through an insulating layer; a drain portion providing a second conductivity type drain layer formed in an inner portion of said well region, a first conductivity type second base layer formed in said well region between said MOS portion and said drain portion; and a field oxide film formed on the surface of said second base layer.

2. A high withstand voltage MIS field effect transistor according to claim 1, wherein an edge portion of said drain layer is connected to an edge portion of said well region and the drain portion includes structure that provides said drain layer with a high withstand voltage.

3. A high withstand voltage MIS field effect transistor according to either of claims 1 or 2, wherein a first conductivity type high concentration buried layer is formed under said drain layer.

4. A high withstand voltage MIS field effect transistor according to either of claims 1 or 2, wherein when a reverse bias voltage of approximately 30 V is applied to said source layer and said drain layer, said MOS portion is a high withstand voltage MOS portion in which a depletion layer is expanded from said pair of base layers to said well region.

5. A high withstand voltage MIS field effect transistor according to either of claims 1 or 2, wherein a source electrode connected to said source layer is a field plate type source electrode extended by approximately 5 micrometer or more onto the field oxide film on said second base layer; and a drain electrode connected to said drain layer is a field plate type drain electrode extended by approximately 5 micrometer or more onto the field oxide film on said second base layer.

6. A high withstand voltage MIS field effect transistor according to either of claims 1 or 2, wherein the impurity concentration of said second base layer is lower than the impurity concentration of said first base layer.

7. A high withstand voltage MIS field effect transistor according to either of claims 1 or 2, wherein said second base layer and said source layer are substantially concentrically formed with respect to the center of said drain layer.

8. A high withstand voltage MIS field effect transistor according to claim 7, wherein said second base layer is structured to provide an area through which said well layer and said field oxide film contact each other.

9. A high withstand voltage MIS field effect transistor having a second conductivity type well region formed on a first conductivity type semiconductor substrate; a MOS portion providing in an outer portion of the well region, a second conductivity type source layer formed in a base layer and a gate electrode disposed through an insulating gate film over the source layer and an area of said well region; a drain portion providing a second conductivity type drain layer formed in an inner portion of said well region; a first conductivity type offset region formed in said well region between said MOS portion and said drain portion; and a conducting layer disposed through an insulating film over said offset region.

10. A high withstand voltage MIS field effect transistor according to claim 9, wherein said conductor layer is of polycrystalline silicon.

11. A high withstand voltage MIS field effect transistor according to claim 9 or 10, wherein at least one portion of said offset region is formed under said gate electrode.

12. A high withstand voltage MIS field effect transistor according to claim 9 or 10, wherein said offset region provides at least two or more offset island regions.

13. A high withstand voltage MIS field effect transistor according to claim 9 or 10, wherein said MOS portion is a MOS portion providing at least one pair of said base layers and source layers, said gate electrode is disposed over the source layers and adjacent areas of said well region, and at least one of said base layers is electrically connected to said offset region.

14. A high withstand voltage MIS field effect transistor according to either of claims 9 or 10, wherein a source electrode connected to said source layer is a field plate type source electrode extended toward said drain layer.

15. A high withstand voltage MIS field effect transistor according to either of claims 9 or 10, wherein a drain electrode connected to said drain layer is a field plate type drain electrode extended toward said MOS portion.

16. A high withstand voltage MIS field effect transistor according to either of claims 9 or 10, wherein the drain portion is to provide said drain layer with a high breakdown voltage with an inner portion of said well region being connected to the drain layer.

17. A high withstand voltage MIS field effect transistor according to either of claims 9 or 10, wherein a first conductivity type high concentration buried layer is formed under said drain layer.

18. A high withstand voltage MIS field effect transistor according to either of claims 9 or 10, wherein said source layer is substantially concentrically formed with said drain layer as the center.

19. A high withstand voltage MIS field effect transistor having a second conductivity type well region formed on a first conductivity type semiconductor substrate; a MOS portion providing, in an outer portion of the well region, a first conductivity type base layer, a second conductivity type source layer formed in the base layer and a gate electrode disposed through an insulating gate film over the source layer and said well region; a drain portion providing a second conductivity type drain layer formed in an inner portion of said well region, said MOS portion being generally concentrically formed with said drain portion as the center, at least one portion of said well region, said MOS portion and said drain portion being a withstand voltage region capable of enduring a desired withstand voltage with reference to the distance between said MOS portion and said drain portion and having a voltage transferring means capable of transferring the voltage in the withstand voltage region to said well region; and
said voltage transferring means including a plurality of field plates spaced from each other and disposed generally concentrically about said drain portion and within said MOS portion and contacting said withstand voltage region to provide voltage control thereover.

20. A high withstand voltage MIS field effect transistor according to claim 19, wherein said MOS portion and said field plates are disposed about said drain portion with at least some off-concentricity.

21. A semiconductor integrated circuit device according to any one of claims 1 or 2 or 19, wherein said high withstand voltage MIS field effect transistor is formed on a substrate which includes at least one of a bipolar transistor capable of composing a logic circuit or a MIS field effect transistor.

22. A semiconductor integrated circuit device according to any one of claims 1 or 2 or 19, wherein said high withstand voltage MIS field effect transistor is formed on the same substrate as a first conductivity type MIS field effect transistor which is connected in at least one of a digital circuit and an analog circuit, and said well region and a second conductivity type well layer of the MIS field effect transistor are commonly formed.

* * * * *

UNITED STATES PATENT AND TRADEMARK OFFICE
CERTIFICATE OF CORRECTION

PATENT NO. :   5,432,370
DATED      :   July 11, 1995
INVENTOR(S) :  Akio KITAMURA et al It is certified that error appears in the above-indentified patent and that said Letters Patent is hereby corrected as shown below:

Claim 1, col. 17, line 8, "in" should read --on--.

Claim 13, Col. 18, line 12, ".adjacent" should read --adjacent--.

Signed and Sealed this

Twelfth Day of November, 1996

Attest:

BRUCE LEHMAN

Attesting Officer          Commissioner of Patents and Trademarks